United States Patent
deVilliers et al.

(10) Patent No.: US 9,718,082 B2
(45) Date of Patent: Aug. 1, 2017

(54) INLINE DISPENSE CAPACITOR

(71) Applicant: Tokyo Electron Limited, Minato-ku, Tokyo (JP)

(72) Inventors: Anton deVilliers, Clifton Park, NY (US); Ronald Nasman, Averill Park, NY (US); James Grootegoed, Wynantskill, NY (US); Norman A. Jacobson, Jr., Scotia, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/600,821

(22) Filed: Jan. 20, 2015

(65) Prior Publication Data

US 2015/0209818 A1  Jul. 30, 2015

Related U.S. Application Data

(60) Provisional application No. 61/931,680, filed on Jan. 26, 2014, provisional application No. 61/987,013, filed on May 1, 2014.

(51) Int. Cl.
*B05C 5/02* (2006.01)
*B05C 11/10* (2006.01)
(Continued)

(52) U.S. Cl.
CPC .......... *B05C 5/0225* (2013.01); *B05C 5/0204* (2013.01); *B05C 9/10* (2013.01);
(Continued)

(58) Field of Classification Search
CPC . B05C 11/1013; B05C 5/0204; B05C 5/0225; B05C 9/10; H01L 21/67017; H01L 21/67051; Y10T 137/7787; G05D 16/2093
(Continued)

(56) References Cited

U.S. PATENT DOCUMENTS 2,353,143 A * 7/1944 Bryant ............... F16K 7/075
137/492
2,467,150 A * 4/1949 Nordell ............... F16K 7/075
137/487
(Continued)

FOREIGN PATENT DOCUMENTS

| CN | 1873286 | 12/2006 |
|---|---|---|
| KR | 10-2006-0065188 | 6/2006 |
| TW | 200633942 | 10/2006 |

OTHER PUBLICATIONS

International Patent Application No. PCT/US2015/012230, "International Search Report and Written Opinion," mailed Apr. 29, 2014, International filing date Jan. 21, 2015.
(Continued)

*Primary Examiner* — William McCalister

(74) *Attorney, Agent, or Firm* — DLA Piper LLP US

(57) ABSTRACT

A fluid dispensing apparatus is disclosed. Systems include an in-line or linear bladder apparatus configured to expand to collect a charge of fluid, and contract to assist with fluid delivery and dispensing. During a dispense-off period process fluid can collect in this bladder after the process fluid is pushed through a fine filter (micro filter). A given filtration rate can be less than a dispense rate and thus the system herein compensates for filter-lag that often accompanies fluid filtering for microfabrication, while providing a generally linear configuration that reduces chances for defect creation.

19 Claims, 2 Drawing Sheets

(51) Int. Cl.
*B05C 9/10* (2006.01)
*H01L 21/67* (2006.01)

(52) U.S. Cl.
CPC .... *B05C 11/1013* (2013.01); *H01L 21/67017* (2013.01); *H01L 21/67051* (2013.01); *Y10T 137/7787* (2015.04)

(58) Field of Classification Search
USPC .................................. 137/485–492.5; 251/5
See application file for complete search history.

(56) References Cited

U.S. PATENT DOCUMENTS

| | | | | |
|---|---|---|---|---|
| 2,517,820 A * | 8/1950 | Aagaard | ............ | G05D 16/0613 137/489 |
| 2,573,864 A * | 11/1951 | Moran | ..................... | B66B 1/24 137/115.13 |
| 2,598,307 A * | 5/1952 | Rutgers | .................. | D01D 1/065 137/115.16 |
| 2,731,039 A * | 1/1956 | Barrett | ................ | G05D 16/0619 137/489 |
| 2,898,088 A * | 8/1959 | Alder | ...................... | E21B 47/12 137/484.2 |
| 2,988,103 A * | 6/1961 | Canvasser | ................ | E03C 1/106 137/218 |
| 3,272,470 A * | 9/1966 | Bryant | ................... | F02M 47/02 137/494 |
| 3,511,268 A * | 5/1970 | Dubrovsky | ............. | G01F 1/372 137/487 |
| 3,669,142 A * | 6/1972 | Gerbic | ................... | F16K 7/075 137/489 |
| 4,138,087 A * | 2/1979 | Kruse | ..................... | F16K 7/075 137/489 |
| 4,195,810 A * | 4/1980 | Lavin | ........................ | F16K 7/07 251/5 |
| 4,300,748 A * | 11/1981 | Kreeley | .................... | F16K 7/10 137/489 |
| 4,442,954 A * | 4/1984 | Bergandy | ................ | F16K 7/045 137/488 |
| 5,035,259 A * | 7/1991 | Allen | ...................... | E21B 35/00 137/488 |
| 5,048,559 A * | 9/1991 | Mathieu | .............. | F04B 11/0016 137/488 |
| 5,158,230 A * | 10/1992 | Curran | ..................... | F24F 11/04 137/486 |
| 6,120,001 A * | 9/2000 | Donahue | .............. | G05D 7/0688 137/486 |
| 6,568,416 B2 * | 5/2003 | Tucker | ............... | G05D 16/2053 137/14 |
| 6,684,903 B2 * | 2/2004 | Williamson | ......... | A47G 21/185 137/494 |
| 7,302,959 B2 * | 12/2007 | Gonia | ................ | B60H 1/00664 137/14 |
| 7,703,477 B2 * | 4/2010 | Cook | ...................... | F16K 7/075 137/489 |
| 2006/0075965 A1 | 4/2006 | Lee et al. | | |
| 2006/0174656 A1 | 8/2006 | Flynn | | |
| 2006/0275141 A1 | 12/2006 | Ogawa et al. | | |
| 2008/0169230 A1 | 7/2008 | Nakagawa | | |
| 2008/0230492 A1 | 9/2008 | Kao et al. | | |

OTHER PUBLICATIONS

Pulsation Dampeners, Liquid Dynamics International, Inc., product listing, retrieved from the Internet on Jan. 20, 2015, pp. 1-9, (http://www.liquid-dynamics.com/pulsation-damper/index.html), Hampstead, NC, USA.

PumpGuard Flow Through Flex Tube Pulsation Dampener, retrieved from the Internet on Jan. 20, 2015, pp. 1-2, (http://www.pulseguard.com/dampener-drawings/elastomer-bladder-pumpguard.html), Hampstead, NC, USA.

Clear-Flow Pulsation Dampener for Viscous Liquids and Slurries, retrieved from the Internet on Jan. 20, 2015, pp. 1-3, (http://www.pulseguard.com/pressure-pulse-dampers/food-drug/pipe-hugger-food-drug-beverage-viewsheet.htm), Hampstead, NC, USA.

Pulsation Dampner, Hose Tube Clearflow, Food and Drug, retrieved from the Internet on Jan. 20, 2015, pp. 1-2, (http://www.pulsation-dampners.com/Pulsation-Dampner-Hose-Tube-clearflow-food-and-Drug.html), Hampstead, NC, USA.

Pulsation Dampner, Hose Tube, Sludge Slurry, retrieved from the Internet on Jan. 20, 2015, pp. 1-2, (http://www.pulsation-dampners.com/Pulsation-Dampner-Hose-Tube-Sludge-Slurry.html), Hampstead, NC, USA.

Taiwanese Office Action (with English Translation) issued in TW Application No. 104102486 dated Aug. 17, 2016.

English Language Abstract and English Language Translation of CN 1873286 published Oct. 1, 2006.

* cited by examiner

INLINE DISPENSE CAPACITOR

CROSS REFERENCE TO RELATED APPLICATIONS

The present application claims the benefit of U.S. Provisional Patent Application No. 61/931,680, filed on Jan. 26, 2014, entitled "Inline Dispense Capacitor," which is incorporated herein by reference in its entirety. The present application also claims the benefit of U.S. Provisional Patent Application No. 61/987,013, filed on May 1, 2014, entitled "Inline Dispense Capacitor," which is incorporated herein by reference in its entirety.

BACKGROUND OF THE INVENTION

This disclosure relates to semiconductor fabrication, and, in particular, to film dispensing/coating and developing processes and systems.

Various processes on coater/developer tools specify different chemicals to be dispensed onto a substrate or wafer for specific types of processing. For example, various resist or photoresist coatings can be dispensed onto a substrate surface. Also, various developers and solvents can be dispensed onto a wafer. One challenge, however, in dispensing various chemicals onto a wafer is avoiding defects in the dispensed chemicals. Any small impurity or coagulation in the chemical can create defects on a wafer. As semiconductor features continue to decrease in size, avoiding and removing defects from dispensed chemicals becomes increasingly important.

SUMMARY

One option to avoid defects from liquids dispensed onto a substrate is to purchase pre-filtered chemistry for use in a coater/developer tool. Such pre-filtered chemistry, however, can be very expensive and can develop defects in the chemistry during transport or use despite pre-filtering. Another option to avoid defects is to filter chemicals at a semiconductor fabrication tool (for example, coater/developer) immediately prior to dispensing on a substrate. One complication with filtering immediately prior to dispensing is a reduction in flow rate. For example, to deliver fluid that has been sufficiently filtered to meet purity requirements, relatively fine filters are required. A challenge with using fine filters is that such filters decrease a rate of fluid flow of a given chemistry as the fluid chemistry is being pushed through these relatively fine filters. Many semiconductor fabrication processes require specific chemistries to be dispensed at a flow rate that adheres to specified parameters. Having a flow rate above or below such a given specified flow rate can result in defects on a substrate. In other words, it is difficult to push a fluid through increasingly fine filters at an acceptably fast rate.

Techniques disclosed herein provide a system that compensates for relatively slow fluid filtering rates while simultaneously providing specified dispense flow rates. In other words, systems herein can dispense a filtered liquid onto a substrate at a dispense rate faster than a filtration rate. Such a system can include a dispense capacitor located between a filter and a dispense nozzle. The dispense capacitor includes a flexible membrane or surface that selectively flexes to either increase or decrease fluid flow and/or pressure. Furthermore, the dispense capacitor defines an approximately linear fluid conduit free from defect-inducing geometry. In one embodiment, the system can include a bladder or flexible line component that can flex outwardly to increase an amount of fluid within a delivery line between the filter and the dispense nozzle, and/or that can contract to decrease an amount of fluid in the delivery line such as to maintain a specific pressure and/or flow rate. Such a system is advantageous in that a given dispensed chemical fluid can be filtered immediately prior to being dispensed on a wafer, using a relatively fine filter, and while still maintaining a specified dispense rate that may be faster than a filtration rate.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
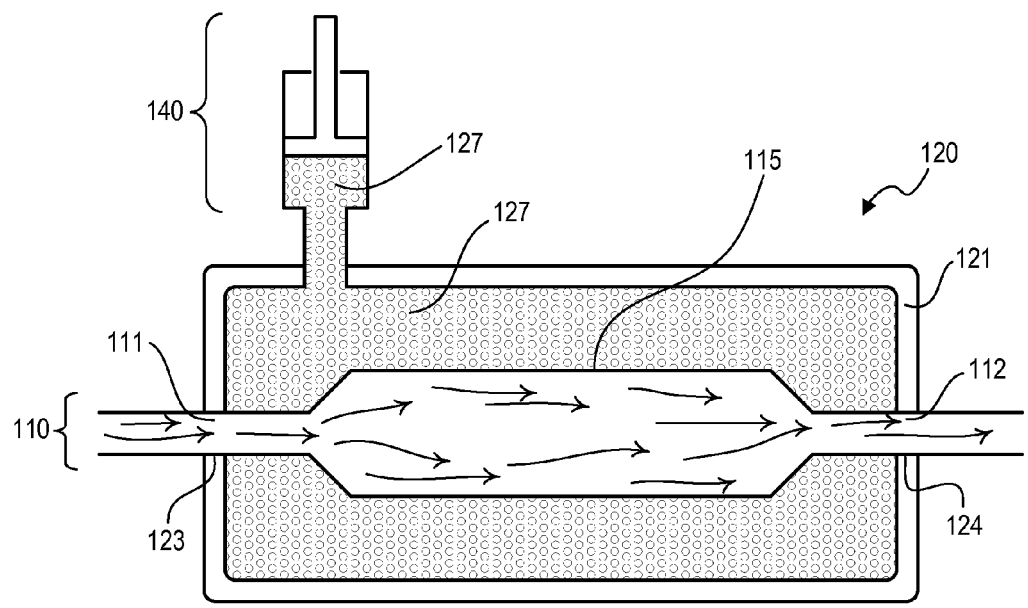
FIG. 1 is a cross-sectional schematic view of a dispense capacitor as described herein.

Techniques herein can be embodied as an in-line dispense system that compensates for filter-lag that often accompanies fluid filtering for microfabrication. This dispense solution herein further reduces chances for defect creation. Conventionally, fluid delivery systems that have a dead leg hanging off a fluid line (such as for a pressure measuring device or reservoir) or other discontinuities there is a significant chance of creating defects in the fluid. Fluid connectors are designed to reduce imperfections on fluid conduit walls (inside walls). Any rough connectors or bends can cause places where fluid can recirculate, slow down, or otherwise get stopped which can cause coagulation. Thus, having a piston, baffle, or side-attached reservoir can create a lot of undesirable cross flow and places for fluid to get stuck. Such cross flow and slow spots can lead to particle creation within the fluid, which particles become defects when dispensed on a given substrate, such as a silicon wafer.

Accordingly, systems herein include an in-line (linear) bladder apparatus. Better fluid dispense results are achieved when this in-line bladder is configured as a through tube (approximately uniform cross-section) that does not allow fluid to have cross flows or slowing of fluid flow. During a dispense-off period, that is when fluid is not being dispensed from a corresponding nozzle onto a substrate, process fluid can collect in this bladder (as an expanding bladder) after the process fluid is pushed through a fine filter (micro filter). In one embodiment, a fluid dispense capacitor is configured to be filled with fluid having been filtered just prior to entering the dispense capacitor during a dispense-off period. In some example dispense applications a given fluid is dispensed at a predetermined flow rate (such as 0.4 to 1.4 cubic centimeters per second), and this fluid is dispensed (on to a substrate) for relatively short time such as for about one second and then the fluid dispense system may not be used again for a rest period. This rest period may be anywhere from about 15 seconds to 60 seconds or more.

When dispensing from the nozzle is reinitiated, the in-line bladder reverses from a state of collecting process fluid to state of expelling process fluid. In other words, this substantially linear bladder has the capacity to expand to collect a charge of process fluid and then be selectively compressed to assist with maintaining a particular process fluid flow rate by discharging a collected charge of fluid. Thus, such a configuration provides a system having a dispense capacitor, which includes a bladder or expandable member configured to expand to receive a charge of fluid and to contract to help expel a built-up charge of fluid, all while maintaining a substantially linear flow path of the process fluid through the bladder.

Expansion and contraction of the dispense capacitor can be accomplished via a coupled pneumatic or hydraulic system that controls a pressure control fluid surrounding the in-line bladder. There can be various cross-sectional shapes of the in-line bladder such as circular, square, and oval. For convenience in describing embodiments herein this disclosure will primarily focus on a bladder having an approximately oval or circular shape. Different cross-sectional shapes offer different advantages. One advantage with using a bladder having an oval cross-sectional shape is having two relatively flat opposing surfaces which can be the primary deflection surfaces for expansion and contraction. In cross-sectional shapes that are substantially uniform or symmetrical (such as a circular cross-section), all sidewall surfaces would be able to expand and contract roughly uniformly.

Referring now to FIG. 1, a simplified schematic of an apparatus for fluid delivery, such as dispense capacitor, is illustrated and will be described herein. The apparatus includes a pressurized fluid housing 120 defining a pressure control chamber 121. Pressurized-fluid housing refers to a housing or structure configured to receive and contain fluids under various pressures. The pressure control chamber 121 has a fluid inlet 123 and a fluid outlet 124. The pressurized fluid housing is configured to contain a pressure control fluid 127. Any of various materials can be used for construction of the pressurized fluid housing 120. Note that the pressure control chamber 121 can be embodied in various shapes and configurations. For example, in some embodiments, the pressurized fluid housing 120 can define a longitudinal pressure control channel. In other words, a chamber that has roughly a same shape as bladder 115 can be defined. In such embodiments, the pressurized fluid housing can include a pressure control fluid inlet. In other embodiments, an entire side or section of the pressure control housing can be actuated to create pressure differentials.

A bladder 115, or other expandable/shrinkable conduit, is positioned within the pressure-control chamber 121. The bladder 115 has a process fluid inlet 111 connected to the fluid inlet 123 of the pressure-control chamber 121. The bladder 115 also has a process fluid outlet 112 connected to the fluid outlet 124 of the pressure-control chamber 121. Bladder 115 defines an approximately linear flow path between the process fluid inlet 111 and the process fluid outlet 112. Thus, process flow fluid 110 can flow generally linearly through bladder 115. By way of example, process flow fluid 110 can include photoresist compositions, block copolymers, solvents, etc., for deposition on a given substrate.

Bladder 115 is configured to expand and contract within the pressure-control chamber (or longitudinal pressure control channel) such that a volume defined by the bladder can be increased and decreased. Bladder 115 has a bladder length that is greater than a bladder cross-sectional height. In other words, instead of a conventional bladder (such as a fuel bladder) that forms a box or spherical shape, bladder 115 herein is configured to have a generally linear shape (flow path).

The pressure-control chamber 121 (or longitudinal pressure control channel) is configured to contain a pressure-control fluid 127 surrounding the bladder 115. The pressure-control chamber 121 including a pressure-control mechanism 140 that selectively increases or decreases a fluid pressure of the pressure-control fluid 127 exerted on an exterior surface of the bladder 115. A controller is configured to activate the pressure-control mechanism 140 and selectively increase or decrease the fluid pressure of the pressure-control fluid 127 exerted on the exterior surface of the bladder 115 such that the volume defined by the bladder selectively increases or decreases. Note that in FIG. 1 bladder 115 is illustrated showing an expanded state. This expansion is illustrative only and not to scale as such an expansion in practice may not be easily visible.

In one embodiment, the pressure-control mechanism can include pulling pressure-control fluid 127 from the pressure-control chamber 121, and pushing pressure-control fluid 127 into the pressure-control chamber 121. Such a pressure-control mechanism or system can include using a pneumatic or hydraulic system that selectively increases or decreases a gas or liquid surrounding the bladder. Such a system can, for example, use a piston to move process control fluid into and out of the pressure-control chamber. In some embodiments, such a piston can be located outside of the pressure-control chamber. In other embodiments, a piston surface can define one wall or interior surface of the pressure-control chamber.

Surrounding bladder 115 within the pressure-control chamber is pressure control fluid 127, which can be contained within the pressurized fluid housing while also being separated from the process flow fluid 110. One or more openings in the housing can be used to increase or decrease an amount of pressure-control fluid within the housing, such as by using a hydraulic or pneumatic system coupled to the pressurized fluid housing. The pressure control fluid can be any hydraulically compatible fluid such as mineral oil, oil, water, etc. Fluids can also include various gases. Alternatively a pneumatic system can be used for charging and discharging process flow fluid. Another alternative is a mechanical system that physically moves surfaces of the bladder inwardly or outwardly. The process flow fluid 110 can be any number of fluids used in a coating/developing or lithographic process. Process fluids can include photoresists, developers, etching fluids, polymeric fluids, and so forth. Material selected for the pressurized fluid housing should be generally rigid relative to the bladder material. The bladder material can be selected from various flexible yet fluid impermeable materials such as various membranes, metals, Teflon, polymers, or elastomers, rubber, and Teflon-coated rubber materials. Essentially any material and/or material thickness that provides sufficient deflection to collect a volume of fluid and then push the collected volume of fluid towards an outlet or dispenser (nozzle).

Figure 3:
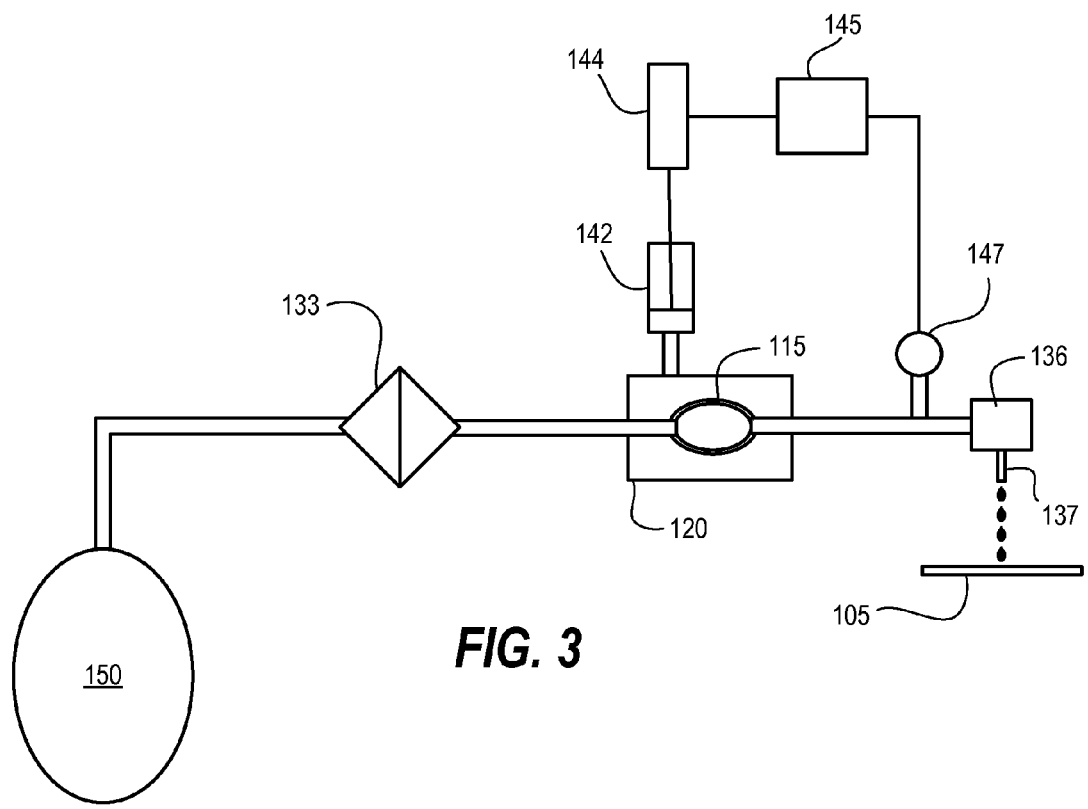
FIG. 3 is a simplified schematic of a control system for a dispense capacitor as described herein.

FIG. 3 is a simplified control diagram illustrating use of an example fluid dispense apparatus. In operation, a given process fluid is stored in a pressure-controlled liquid ampoule 150. This pressure-controlled liquid ampoule can include a mechanism for driving process fluid from the ampoule toward a filter 133 via a conduit or pipe. Pushing process fluid through filter 133 can be a relatively slow process when using a high-purity filter. Example filtration rates can be slower than specified dispense rates for depositing process fluids onto a substrate 105. After a purified process flow fluid passes the filter 133, the process flow fluid begins collecting in the bladder 115 within the hydraulic housing. A piston 142 can be used to actuate the pressurized-fluid system. A linear drive 144, for example, can withdraw piston 142 thereby reducing the amount of pressure control fluid in the pressure-control chamber. This enables the bladder 115 to expand within the hydraulic housing thereby collecting a charge of more process flow fluid.

Such a collection of a charge of process fluid can occur while dispense valve 136 is in an off position. Thus, process flow fluid collects within the bladder 115 inside the pressurized fluid housing 120. With a sufficient amount of process flow fluid collected within the bladder, the dispense capacitor system can begin dispensing liquid on a given substrate via the nozzle 137 at a specified flow rate—which can be greater than a filtration rate. Pressure in the line can be maintained at the process flow fluid source (using pressure-controlled liquid ampoule 150) to prevent back flow through the high purity filter. This can be accomplished by having sufficient pressure to keep some amount of process flow fluid moving through filter 133 even while the bladder 115 is being compressed. With filter backflow prevented, the linear drive 144 moves piston 142 causing more pressure control fluid to enter the pressure-control chamber. The increase in pressure-control fluid essentially squeezes the bladder causing collected process flow fluid to continue through the system conduits or piping towards the nozzle and ultimately onto substrate 105, such as a target wafer. In some embodiments a diaphragm can be used in place of pressurized fluid housing for controlling the bladder.

Note that techniques herein can maintain continuity of flow through the filter 133. That is, while the bladder is charging and while a nozzle is dispensing process fluid can be flowing through the high purity filter. Even with a pressure drop across the filter during a dispense operation, fluid can continue moving through the filter. The advantage of maintaining a continuous flow—including continuous filtration—is that accumulated aggregates on a surface of the filter (caught by the filter) do not have a chance to go back into solution. Other embodiments can include using a hydrostatic lock at a location in the line before a dispense valve, and at a hose portion between the filter and the dispense capacitor such that backflow is not possible. Another advantage is that embodiments can have zero dead space in the fluid delivery system, such as between a fluid source and a dispense nozzle. Having zero dead space further limits opportunities for defect creation.

A controller 145, such as a PID controller (proportional/integral/derivative) can be used to control pneumatic or hydraulic pressure to yield a specific flow rate of the process flow fluid as it exits the nozzle. After completion of fluid being dispensed at the nozzle, the nozzle can be closed and process flow fluid can begin again collecting in the bladder of the dispense capacitor system in preparation for a subsequent dispense operation or series of dispense operations. Note that a pressure sensor 147 can be used to provide feedback to the PID controller. Alternatively, a pressure sensor can be integrated within the pressure-control chamber thereby eliminating a need for a separate T-connection for reading pressure of the process flow fluid during a dispense operation.

Figure 4:
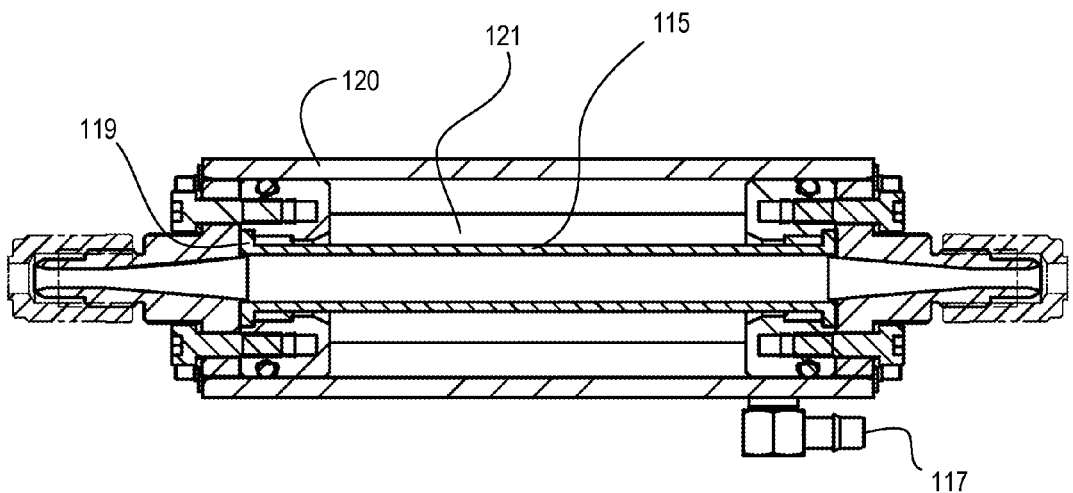
FIG. 4 is a cross-sectional diagram of an example embodiment of a dispense capacitor as described herein.

FIG. 4 is a cross-sectional diagram of an example embodiment of a fluid delivery apparatus. FIG. 4 shows the pressurized fluid housing 120, the pressure-control chamber 121, and bladder 115. Note that bladder 115 can include flanges 119 at fluid inlets and fluid outlets. Pressure control fluid inlet 117 can be attached to a pressure-control system. Because the bladder will be expanding and contracting, securing ends of the bladder to the housing is beneficial to maintain proper operation. The flange 119 can be compressed around a lip to create a seal such that leakage of fluid is prevented and such that process flow fluid does not form defects due to slowing of fluid at such connection spots. Bladder 115 can have a cross-sectional shape that is approximately oval in some embodiments. By using an oval-shaped bladder or rectangular bladder with rounded corners, deflection of the bladder can be designed to predominantly occur at opposing flat surfaces of this bladder.

Various materials can be selected for constructing the bladder. Example flexible materials can include rubber, synthetic rubber, elastomer, thin-walled metal, stainless steel, fluoropolymer elastomers, and so forth. In some embodiments, interior surfaces of the bladder can be coated for protection, defect reduction, etc. Interior coats can be comprised of chemical-resistant materials selected to resist photoresists and solvents such as ethyl lactate and cyclohexanone and others. Example chemical resistant materials include polytetrafluoroethylene (PTFE), and perfluoroalkoxy alkanes (PFA). Deposition can be accomplished by various deposition techniques including chemical vapor deposition (CVD) and filament-assisted CVD. For chemical vapor deposition techniques, a relatively low-pressure deposition environment can be used to ensure uniform coverage throughout a length of the bladder. An alternative embodiment is to overmold synthetic rubber or elastomer over a relatively thinner walled mold or insert made of a chemical resistant material such as polytetrafluoroethylene (PTFE), perfluoroalkoxy alkanes (PFA), fluoroelastomers, and so forth. In some embodiments, thin-walled metal can be used, though using PTFE/PFA fluid connectors with a metal bladder can be beneficial. Another embodiment includes two-shot molding with a chemical-resistant material is formed first as a liner, then an elastomer is formed to fill a remainder of a given mold. Other embodiments can use injection molding, blow molding, or machining of PFA, PTFE, and similar materials without rubber or an elastomer. Note that those skilled in the art will appreciate that many different types of materials and/or coatings can be selected specific to given process fluids to be flowed through the bladder.

The apparatus herein can be incorporated in a semiconductor fabrication tools such as a coater/developer, lithographic tools, and cleaning systems. Systems herein can be optimized for fluids of various viscosities. It should be appreciated that various control circuits and mechanisms can be incorporated to optimize operation of the dispense apparatus. For example, pressure transducers, reducers, particle measurement systems, digital and analog inputs/outputs, microprocessors, power supplies, etc.

Alterative embodiments can use the apparatus as a dispense capacitor, as a pressure sensing device, or both. Using the bladder apparatus as a pressure sensing mechanism can be advantageous in that no "T"-shaped flow paths are needed. Keeping a flow path as smooth and continuous as possible reduces chances of coagulation.

One embodiment includes a pressure sensor apparatus. This includes a pressurized fluid housing defining a pressure-measurement chamber or longitudinal pressure measurement channel. A bladder is positioned within the pressure-measurement chamber or longitudinal pressure measurement channel. This embodiment includes a bladder as described above with corresponding fluid inlets and outlets. A pressure sensor is positioned within the longitudinal pressure measurement channel such that when the longitudinal pressure measurement channel is filled with pressure measurement fluid, the pressure sensor is in contact with the pressure measurement fluid. The pressure sensor is configured to transmit a pressure measurement signal in response to changes in pressure of the pressure measurement fluid caused by expansion or contraction of the bladder. In some embodiments, an incompressible fluid can be used. Note that such an embodiment can be separate from the dispense apparatus above, or combined with the dispense apparatus.

Figure 2:
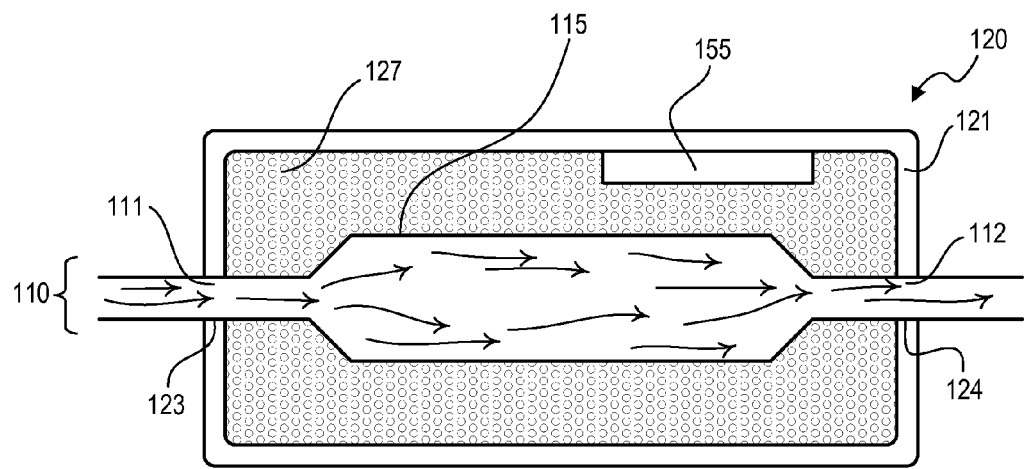
FIG. 2 is a cross-sectional schematic view of a dispense capacitor as described herein.

One benefit with this configuration is that the process fluid (such as a photoresist) is not in direct contact with the pressure sensor, and so a relatively inert fluid can be used as a pressure measurement fluid. The pressure sensor can be configured to transmit a pressure measurement signal in response to changes in pressure of the pressure measurement fluid caused by expansion or contraction of the bladder. FIG. 2 illustrates an example embodiment of using the bladder and pressurized fluid housing as a pressure sensor apparatus. The pressure sensor 155 of FIG. 2 can alternatively be added to FIG. 1 to make a combined dispense capacitor and pressure sensor.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. An apparatus for fluid delivery, the apparatus comprising:
a pressurized fluid housing defining a longitudinal pressure control channel having an inlet opening having an inlet opening diameter and an outlet opening having an outlet opening diameter, the pressurized fluid housing including a pressure control fluid inlet;
a bladder positioned within the longitudinal pressure control channel, the bladder having a process fluid inlet and a process fluid outlet, the process fluid inlet being inserted within the inlet opening of the pressurized fluid housing, and the process fluid outlet being inserted within the outlet opening of the pressurized fluid housing, the bladder defining a longitudinal flow path between the process fluid inlet and the process fluid outlet, the bladder being configured to expand and contract within the longitudinal pressure control channel such that a volume defined by the bladder can be increased and decreased, the bladder having a bladder length that is greater than a bladder cross-sectional height;
the longitudinal pressure control channel configured to contain a pressure control fluid surrounding an exterior surface of the bladder so that the bladder contacts the pressurized fluid housing only at the inlet opening of the pressurized fluid housing and the outlet opening of the pressurized fluid housing, the pressure control fluid inlet being configured such that the pressure control fluid can enter or exit the longitudinal pressure control channel;
a filter connected to the inlet opening via a fluid inlet conduit and positioned to filter the process fluid at a filtration rate before the process fluid enters the bladder; and
a controller configured to activate a pressure-control system that selectively removes pressure control fluid from the longitudinal pressure control channel to increase a volume of the bladder, and that selectively increases pressure control fluid in the longitudinal pressure control channel to decrease a volume of the bladder, wherein the controller is constructed and arranged to expand the bladder to a diameter greater than the inlet opening diameter and the outlet opening diameter such that the process fluid collects in the bladder and thereafter reduce the volume of the bladder to provide a flow rate through the outlet opening that is greater than the filtration rate.

2. The apparatus of claim 1, further comprising a pressure sensor that detects a pressure of the pressure control fluid in the longitudinal pressure control channel.

3. The apparatus of claim 1, further comprising a dispense nozzle coupled to the outlet opening via a fluid outlet conduit.

4. The apparatus of claim 3, wherein the dispense nozzle is configured to dispense the process fluid onto a substrate.

5. The apparatus of claim 1, wherein the bladder has a cross-sectional shape selected from the group consisting of circular, oval, and rectangular.

6. The apparatus of claim 1, wherein the pressure-control system includes a pneumatic system that selectively increases or decreases a gas surrounding the bladder.

7. The apparatus of claim 6, wherein the pneumatic system uses a piston to move process control fluid into and out of the longitudinal pressure control channel.

8. The apparatus of claim 1, wherein the pressure-control system includes a hydraulic system that selectively increases or decreases the pressure control fluid.

9. The apparatus of claim 1, wherein the bladder includes flanges at the process fluid inlet and the process fluid outlet, and wherein the flanges connect with the pressurized fluid housing to form a fluid-sealed connection.

10. The apparatus of claim 1, wherein the bladder is constructed of a flexible material selected from the group consisting of rubber, synthetic rubber, elastomer, thin-walled metal, stainless steel, and fluoropolymer elastomer.

11. An apparatus for fluid delivery, the apparatus comprising:
a pressurized fluid housing defining a pressure-control chamber having an inlet opening having an inlet opening diameter and an outlet opening having an outlet opening diameter, the pressurized fluid housing configured to contain a pressure control fluid;
a bladder positioned within the pressure-control chamber, the bladder having a process fluid inlet and a process fluid outlet, the process fluid inlet inserted within the inlet opening of the pressure-control chamber, and the process fluid outlet inserted within the outlet opening of the pressure-control chamber, the bladder defining an approximately linear flow path between the process fluid inlet and the process fluid outlet, the bladder being configured to expand and contract within the pressure-control chamber such that a volume defined by the bladder can be increased and decreased, the bladder having a bladder length that is greater than a bladder cross-sectional height;
the pressure-control chamber configured to contain a pressure-control fluid circumferentially surrounding an exterior surface of the bladder so that the bladder contacts the pressurized fluid housing only at the inlet opening of the pressure-control chamber and the outlet opening of the pressure-control chamber, the pressure-control chamber interfaced with a pressure-control mechanism that selectively increases or decreases a fluid pressure of the pressure-control fluid exerted on the exterior surface of the bladder disposed between the inlet opening of the pressure-control chamber and the outlet opening of the pressure-control chamber;
a filter connected to the inlet opening via a fluid inlet conduit and positioned to filter the process fluid at a filtration rate before the process fluid enters the bladder; and a controller configured to activate the pressure-control mechanism and selectively increase or decrease the fluid pressure of the pressure-control fluid exerted on the exterior surface of the bladder disposed between the inlet opening of the pressure-control chamber and the outlet opening of the pressure-control chamber such that the volume defined by the bladder selectively increases or decreases, wherein the controller is constructed and arranged to expand the bladder to a diameter greater than the inlet opening diameter and the outlet opening diameter such that the process fluid collects in the bladder and thereafter reduce the volume of the bladder to provide a flow rate through the outlet opening that is greater than the filtration rate.

12. The apparatus of claim 11, wherein the pressure-control mechanism includes a pneumatic system that selectively increases or decreases a gas surrounding the bladder.

13. The apparatus of claim 11, wherein the pressure-control mechanism includes a hydraulic system that selectively increases or decreases the pressure-control fluid.

14. The apparatus of claim 11, wherein the apparatus for fluid delivery is a component of a coater-developer system configured to deposit fluids on semiconductor wafers.

15. The apparatus of claim 11, further comprising a pressure sensor configured to transmit a pressure measurement signal in response to changes in pressure of the pressure control fluid caused by expansion or contraction of the bladder.

16. An apparatus for fluid delivery, the apparatus comprising:
a pressurized fluid housing defining a pressure control chamber having an inlet opening and an outlet opening, the pressurized fluid housing including a pressure control fluid inlet;
a bladder positioned within the pressure control chamber, the bladder having a process fluid inlet and a process fluid outlet, the process fluid inlet connected to the inlet opening of the pressurized fluid housing, and the process fluid outlet connected to the outlet opening of the pressurized fluid housing, the bladder defining a longitudinal flow path between the process fluid inlet and the process fluid outlet, the bladder being configured to expand and contract within the pressure control chamber such that a volume defined by the bladder can be increased and decreased, the bladder having a bladder length that is greater than a bladder cross-sectional height;
a filter connected to the inlet opening via a fluid inlet conduit and positioned to filter the process fluid at a filtration rate before the process fluid enters the bladder, the filter configured to increase purity of a photoresist flowing through the filter as the process fluid;
a dispense nozzle connected to the outlet opening via a fluid outlet conduit, the dispense nozzle positionable over a semiconductor substrate;
the pressure control chamber configured to contain a pressure control fluid in contact with an exterior surface of the bladder, the pressure-control chamber including a pressure-control mechanism configured to selectively increase or decrease a fluid pressure of the pressure-control fluid exerted on the exterior surface of the bladder; and
a controller configured to activate the pressure-control mechanism and selectively cause the bladder to expand in volume and collect a charge of process fluid within the bladder, upon collecting the charge of process fluid the controller being further configured to activate the pressure-control mechanism and selectively cause the bladder to decrease in volume and dispense the charge of process fluid from the dispense nozzle at a flow rate through the dispense nozzle that is greater than the filtration rate through the filter.

17. The apparatus of claim 16, wherein the bladder has a cross-sectional shape selected from the group consisting of circular, oval, and rectangular.

18. The apparatus of claim 16, wherein the pressure-control system includes a hydraulic system that selectively increases or decreases the pressure control fluid.

19. The apparatus of claim 16, wherein the bladder is constructed of a flexible material selected from the group consisting of rubber, synthetic rubber, elastomer, thin-walled metal, stainless steel, and fluoropolymer elastomer.

\* \* \* \* \*